(12) United States Patent
Ferre Fabregas et al.

(10) Patent No.: US 10,790,844 B2
(45) Date of Patent: Sep. 29, 2020

(54) SENSOR MEASUREMENT VERIFICATION IN QUASI REAL-TIME

(71) Applicant: LEAR CORPORATION, Southfield, MI (US)

(72) Inventors: Antoni Ferre Fabregas, Valls (ES); David Gamez Alari, Valls (ES); Federico Giordano, Valls (ES); Jignesh Chauhan, Pune (IN); Om Prakash, Pune (IN); Abhishek Sharma, Bakani (IN)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 16/014,435

(22) Filed: Jun. 21, 2018

(65) Prior Publication Data

US 2019/0393884 A1 Dec. 26, 2019

(51) Int. Cl.

| H03M 1/10 | (2006.01) |
|---|---|
| H03M 1/12 | (2006.01) |
| G01R 35/00 | (2006.01) |
| G01R 31/382 | (2019.01) |

(52) U.S. Cl.
CPC ........ *H03M 1/1071* (2013.01); *G01R 31/382* (2019.01); *G01R 35/007* (2013.01); *H03M 1/1205* (2013.01); *H03M 1/126* (2013.01)

(58) Field of Classification Search
CPC ............ H03M 1/10; H03M 1/12; H03M 1/16; H03M 1/00; H03M 1/004; H03M 1/007; H03M 1/0845; H03M 1/089; H03M 1/306; H03M 1/52; B60L 11/1851; B60L 50/11; B60L 58/10; B60L 11/04; H02J 7/0068; H02J 7/0021; H02J 7/027; H02J 7/047
USPC ......................... 341/112, 115, 116, 117, 120
See application file for complete search history.

(56) References Cited

U.S. PATENT DOCUMENTS

| 6,057,793 A * | 5/2000 | Gong ................ H03H 17/0671 341/143 |
|---|---|---|
| 8,373,585 B2 | 2/2013 | Schaetzle et al. |
| 8,736,468 B2 | 5/2014 | Fabregas et al. |
| 9,234,943 B2 | 1/2016 | Fabregas et al. |
| 2006/0001399 A1* | 1/2006 | Salasoo .................... B60K 6/46 320/104 |
| 2008/0101409 A1* | 5/2008 | West ................ H04L 29/06027 370/473 |
| 2009/0027056 A1* | 1/2009 | Huang .................... B60L 58/16 324/439 |
| 2009/0251103 A1* | 10/2009 | Yamamoto .............. B60L 58/24 320/133 |

(Continued)

*Primary Examiner* — Linh V Nguyen
(74) *Attorney, Agent, or Firm* — Brooks Kushman P.C.

(57) ABSTRACT

A method and system to perform the verification of measures done by a sensor in quasi real-time. The sensor verification may be implemented at two different levels—a functionality level and a measurement level. At the functionality level, a consistency check of information from different variables may be processed at sensor level depending on the functionality of the physical system being measured. At the measurement level, diagnostics may be performed of the circuits present in the measurement path by specific circuitry and at suitable instants of time to guarantee a Fault Tolerant Time Interval while minimizing sample loss. This may be achieved, at least in part, by increasing the measuring sample rate.

14 Claims, 4 Drawing Sheets

(56) References Cited

U.S. PATENT DOCUMENTS

| | | | |
|---|---|---|---|
| 2010/0270955 A1* | 10/2010 | Yamakawa | B60L 15/2045 318/139 |
| 2011/0231122 A1* | 9/2011 | Fabregas | H01M 10/486 702/63 |
| 2013/0154865 A1* | 6/2013 | Fabregas | H03M 1/00 341/158 |
| 2013/0158904 A1 | 6/2013 | Fabregas et al. | |
| 2013/0249721 A1* | 9/2013 | Smith | A61B 18/1206 341/120 |
| 2015/0075286 A1* | 3/2015 | Wuchert | H03M 1/1071 73/514.35 |
| 2017/0232861 A1* | 8/2017 | Saito | B60L 50/11 307/10.1 |
| 2017/0242709 A1* | 8/2017 | Bodner | G06F 9/4418 |
| 2017/0288439 A1* | 10/2017 | Tamegai | H02J 7/0047 |
| 2019/0064849 A1* | 2/2019 | O'Hara | B60L 53/36 |

* cited by examiner

SENSOR MEASUREMENT VERIFICATION IN QUASI REAL-TIME

TECHNICAL FIELD

The present disclosure relates to a method and system for verifying measurements taken by a sensor in quasi real-time.

BACKGROUND

Modern vehicles include systems having complex electric circuits for performing different functions. Common circuits include an analog-to-digital converter ("ADC") in communication with a sensor. The sensor measures a physical quantity and generates an analog electrical signal indicative of the measured physical quantity. The ADC receives the analog signal from the sensor and converts it into a digital electrical signal (i.e., a digital value, a digital output code, etc.).

Once the analog sensor signal is digitalized, it may be processed by a microcontroller and/or to be transmitted to other modules through a network connection. These ADCs have a programmable ADC conversion rate, but usually they work at a fixed frequency, such as 1 kHz. These devices also integrate diagnostic circuits that can monitor the correct behavior of the internal and external circuits. Current implementations need to stop the measure to perform the diagnostics of the circuitry. When the diagnostics is finished, the ADCs' input data buffers need to be filled again and, therefore, the system needs to wait n periods until a valid sample may be completely processed (or output).

SUMMARY

One or more embodiments of the present disclosure is directed to a method for verifying sensor measurements of physical variables in a system. The method may include receiving, during a measurement mode, at least a first sensor signal indicative of a first variable being measured, a second sensor signal indicative of a second variable being measured, and a third sensor signal indicative of a third variable being measured. The method may also include comparing pairs of measured values indicative of the first variable, the second variable, and the third variable to similar pairs of expected values. The expected values may be based on current system conditions. The method may further comprise initiating diagnostics of a measurement path for a faulty variable in response to two pairs of measured values, each including the faulty variable, being outside a predetermined range of expected values. The faulty variable may be one of the first variable, the second variable, or the third variable. The first variable may be a battery voltage, the second variable may be a battery current, and the third variable may be a battery temperature.

Comparing pairs of measured values indicative of the first variable, the second variable, and the third variable to similar pairs of expected values, wherein the expected values are based on current system conditions, may include: comparing a first pair of measured values indicative of the first variable and the second variable to a first pair of expected values based on current system conditions; comparing a second pair of measured values indicative of the first variable and the third variable to a second pair of expected values based on current system conditions; and comparing a third pair of measured values indicative of the second variable and the third variable to a third pair of expected values based on current system conditions.

Initiating targeted diagnostics of a measurement path for a faulty variable in response to two pairs of measured values, each including the faulty variable, being outside a predetermined range of expected values, may include initiating diagnostics of a measurement path for the first variable in response to the first pair of measured values being outside a predetermined range of the first pair of expected values and the second pair of measured values being outside a predetermined range of the second pair of expected values. Alternatively, it may include initiating diagnostics of a measurement path for the second variable in response to the first pair of measured values being outside a predetermined range of the first pair of expected values and the third pair of measured values being outside a predetermined range of the third pair of expected values or initiating diagnostics of a measurement path for the third variable in response to the second pair of measured values being outside a predetermined range of the second pair of expected values and the third pair of measured values being outside a predetermined range of the third pair of expected values.

The first sensor signal, the second sensor signal, and the third sensor signal may all be analog signals. The method may further comprise converting each analog signal into digital samples measured at an oversampling rate and pre-processing the digital samples to generate a digital output for each analog signal at a target sampling rate, wherein the oversampling rate is N times the target sampling rate. The digital output may be computed as an average value of up to N previously measured digital samples.

A first digital output following diagnostics may be computed from less than N previously measured digital samples. Moreover, diagnostics may interrupt the measurement mode. However, no more than one digital output may be lost during diagnostics. A digital output lost during diagnostics may be replaced by one of a moving average, a previously known good sample, and a 3-order spline from previous measures.

One or more additional embodiments of the present disclosure is directed to a method for verifying sensor measurements of physical variables in a system. The method may comprise: receiving at least one sensor signal, each sensor signal indicative of a physical variable being measured; comparing measured values of the at least one sensor signal to expected values, wherein the expected values are based on current system conditions; detecting whether a diagnostic inhibitor is present preventing a diagnostic mode from being initiated; and in the absence of any diagnostic inhibitors, initiating diagnostics of a measurement path for a physical variable in response to one of a) the measured values being outside a predetermined range of the expected values and b) a predetermined time since the last diagnostic mode has expired.

The physical variable may include at least one of a battery voltage, a battery current, and a battery temperature. Further, the diagnostic inhibitor may include a battery cranking event.

One or more additional embodiments of the present disclosure is directed to a method for real-time diagnosing of an analog sensor measurement. The method may comprise: receiving, during a measurement mode, an analog signal indicative of a variable being measured; converting the analog signal into digital samples measured at an oversampling rate; pre-processing the digital samples to generate a digital output at a target sampling rate, wherein the oversampling rate is N times the target sampling rate; and receiving and processing a diagnostic signal, during a diagnostic mode, wherein a last digital output prior to the diagnostic mode is computed from less than N previously measured digital samples. A first digital output following the diagnostic mode may be computed from less than N previously measured digital samples.

The method may further comprise detecting whether a diagnostic inhibitor is present preventing the diagnostic mode from being initiated and initiating the diagnostic mode in the absence of any diagnostic inhibitors.

Receiving and processing a diagnostic signal may comprise interrupting the measurement mode to initiate the diagnostic mode, wherein no more than one digital output at the target sampling rate is lost to the diagnostic mode. The diagnostic mode may be performed using a single sample of the diagnostic signal and a corresponding digital output at the target sampling rate may be interpolated from remaining digital samples to prevent any loss of digital outputs at the target sampling rate. The corresponding digital output may be interpolated from the remaining digital samples using one of a moving average and a 3-order spline.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

For sensors, such as battery diagnostics sensors (BDS), customers may require an assessment that a system is correctly measuring some physical variables (e.g., voltage, current, temperature, or the like) with specific functional safety characteristics and bounded a Fault Tolerant Time Interval (FTTI). The system may assure the functional safety level not only in the sensor but also in the values transferred to other electronic control units (ECUs) via communication interface.

The FTTI is the time that a fault can be present in a system before a hazard occurs. Therefore, the FTTI represents a total target time the system needs to meet in order to transition to a safe state. The system, whenever possible, needs to switch to a safe state within the FTTI. To ensure safety of a system the time to detect a fault (Diagnostic Test Interval) plus the time for the system to achieve a safe state (Fault Reaction Time Interval) shall be less than the FTTI for the safety goal, as expressed in the equation below:

FTTI>Diagnostic Test Interval (DTI)+Fault Reaction Time Interval (FRTI)

Many sensors use analog-to-digital converters (ADCs) to digitalize the physical magnitudes to be processed by a microcontroller and/or to be transmitted to other modules. As previously stated, these ADCs have a programmable ADC conversion rate, but usually they work at a fixed frequency, such as 1 kHz. These devices integrate diagnostics circuits that can monitor the correct behavior of the internal and external circuits provided in the sensing system.

Figure 1:
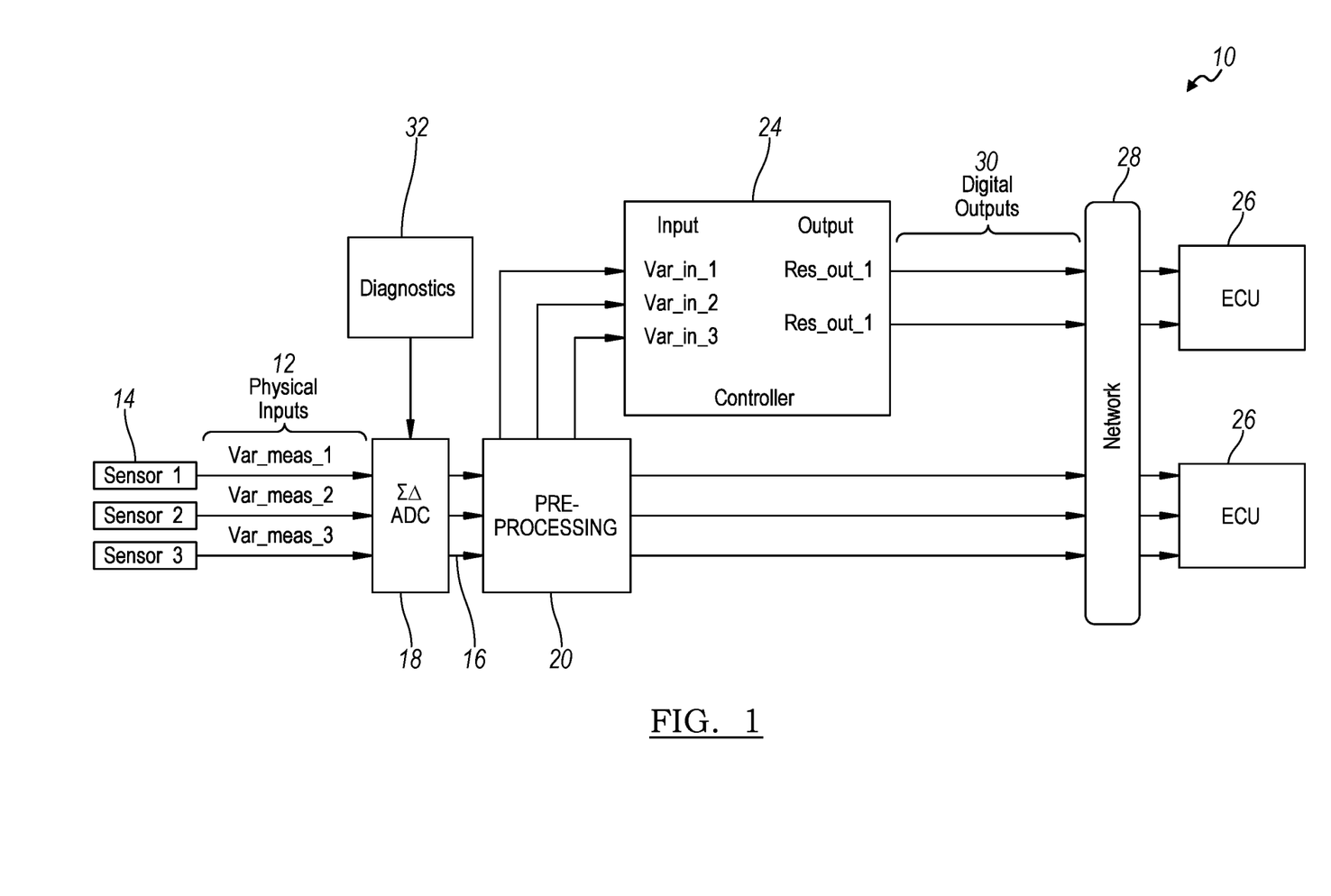
FIG. 1 is a block diagram of a system for verifying sensor measurements, in accordance with one or more embodiments of the present disclosure.

FIG. 1 shows a block diagram of a system 10, according to one or more embodiments of the present disclosure. The system 10 may include inputs 12 for receiving measurements of physical variables using one or more sensors 14. The sensors 14 measure a physical quantity and generate an analog electrical signal indicative of the measured physical quantity. The analog inputs may be converted to digital electrical signals (i.e., a digital value, a digital output code, digital sample, etc.) 16 using an ADC 18, such as a Sigma-Delta ADC, at a predetermined sample rate. The digital samples 16 may then be received at a pre-processor 20 for pre-processing.

Pre-processing may process the digital samples 16 into usable values or data for a controller 24, where the digital data may be further processed according to an algorithm. The pre-processor 20 may determine what information is provided to the controller 24. The pre-processed digital samples may be fed to the controller 24 at a constant rate. The results of the algorithm may be output to other electronic control units (ECUs) 26 (i.e., modules, controllers, etc.) through a network connection 28. Pre-processed values may also be output directly to other ECUs. The pre-processed values, together with the results of the algorithm, may be collectively referred to as digital outputs 30. The system may also include a diagnostic circuit 32 that can monitor the behavior of internal and external circuits and verify that the sensor measurements are correct.

According an embodiment, one or more of the components described above may be integrated with the sensor 14 into a single component. For instance, the ADC 18, the pre-processor 20, and/or the diagnostic circuit 32 may be integrated with the sensor 14 into a single component that may be digitally connected to the controller 24 through a network connection. In this case, the sensor may provide digital samples or outputs directly to the controller 24. Accordingly, the sensor signals may be analog or digital depending on the application.

Figure 2:
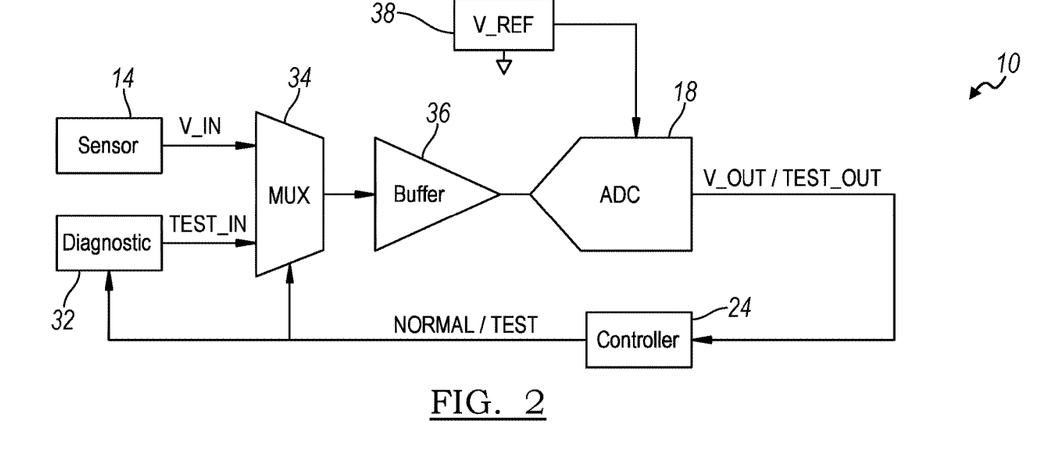
FIG. 2 is a functional diagram of the system, in accordance with one or more embodiments of the present disclosure.

To verify the system is measuring correctly, several mechanisms may be available. At low level, the hardware could include specific circuitry to diagnose the measurement path (i.e., all elements integrated in this measurement path). FIG. 2 is a functional diagram showing details of the system 10 in accordance with an embodiment of the present disclosure. The system 10 is enabled to detect the integrity of the sensor measurements by performing diagnostics of the circuitry.

The system includes a sensor 14. The sensor 14 measures a physical quantity and generates an analog electrical signal indicative of the measured physical quantity. The analog signal generated by the sensor 14 may be a voltage signal and is designated herein as the sensor input $V_{IN}$. In alternative or additional embodiments, the analog signal generated by the sensor 14 may be a current signal.

The system 10 may further include an analog multiplexor 34. As shown in FIG. 2, the output of the multiplexor 34 may be directly connected to the input of the ADC 18. The multiplexor 34 may be configured to receive two inputs: (i) the sensor input $V_{IN}$ from the sensor 14; and (ii) a test input signal $TEST_{IN}$ from the diagnostic circuit 32. As such, the ADC 18 may be multiplexed with two voltages: (i) the input voltage to be measured (i.e., the sensor input $V_{IN}$ from the sensor 14); and (ii) a test voltage (i.e., the test input signal $TEST_{IN}$ from the diagnostic circuit 32). In alternative or additional embodiments, the test input signal $TEST_{IN}$ may be a current signal.

The multiplexor 34 may be configured to select one of the sensor input $V_{IN}$ and the output voltage of the diagnostic circuit $TEST_{IN}$ and forward the selected voltage to the ADC 18 via a buffer 36. For instance, at one time, the multiplexor 34 may select the sensor input $V_{IN}$ and forward the sensor input $V_{IN}$ to the ADC 18. Conversely, at another time when the diagnostic circuit 32 outputs the test input signal $TEST_{IN}$, the multiplexor 34 may select the test voltage $TEST_{IN}$ and forwards the test voltage $TEST_{IN}$ to the buffer 36 for subsequent transmission to the ADC 18.

In normal operation, when the multiplexor 34 is configured to output the sensor voltage $V_{IN}$, the ADC 18 generates the digital output code for the sensor input $V_{IN}$ by comparing the sensor input $V_{IN}$ with a reference voltage $V_{REF}$ provided by a voltage reference 38. The voltage reference 18 may be externally provided to the ADC 18 or may be internally generated in the ADC itself. The reference voltage $V_{REF}$ is intended to be a precise 'measuring stick' against which the sensor input $V_{IN}$ is compared. Under error free operation, the ADC 18 may generate the digital output code for the sensor input $V_{IN}$ according to the following equation:

$$\text{output} = V_{IN} * (2^n / V_{REF})$$

where "output" is the digital output code in decimal form and "n" is the number of bits of resolution of the ADC. The resolution indicates the number of discrete values the ADC can produce over the range of analog values. The values are usually stored in binary form so the resolution is expressed in bits. For example, an ADC with a resolution of eight bits can encode the analog sensor input $V_{IN}$ to one in 256 different levels since $2^8 = 256$.

The system 10 may include a microcontroller, for example, the controller 24. As shown in FIG. 2, the output of the ADC 18 may be connected to the controller 24 such that the controller receives the digital output code $V_{out}$ for the sensor input $V_{IN}$ from the ADC 18. The controller 24 generally uses the digital output code $V_{out}$ for the sensor input $V_{IN}$ to control various functions. For instance, in one embodiment, the sensor 14 may generate a sensor input $V_{IN}$ indicative of a measured physical quantity of a battery of an electric vehicle (not shown) and the controller 24 may control operation of the battery based on the corresponding digital output code $V_{out}$ for the sensor input $V_{IN}$.

The controller 24 may generate a control signal NORMAL/TEST to switch between a normal measuring mode and a diagnostic mode. The control signal NORMAL/TEST may be provided from the controller 24 to the multiplexor 34 as shown in FIG. 2. The selection operation of the multiplexor 34 may select the sensor input $V_{IN}$ while receiving the control signal NORMAL/TEST in a first state (i.e., "NORMAL"). On the other hand, while the control signal NORMAL/TEST is provided from the controller 24 to the multiplexor 34 in a second state (i.e., "TEST"), the multiplexor may select the test voltage $TEST_{IN}$. The control signal NORMAL/TEST may also be received by the diagnostic circuit 32 to trigger commencement of the diagnostics.

As such, when the diagnostic circuit 32 is controlled per the above-described operation to generate the test input signal $TEST_{IN}$, the multiplexor 34 selects the test input signal $TEST_{IN}$ instead of the sensor input $V_{IN}$ and provides the test input signal $TEST_{IN}$ to the ADC 18 by way of the buffer 36. In this case, the test input signal $TEST_{IN}$ rather than the sensor input $V_{IN}$ is provided as the analog input signal to the ADC 18. In turn, the ADC 18 converts this analog input signal, which during this time is the test input signal $TEST_{IN}$, into a digital output test code $TEST_{OUT}$ using the reference voltage $V_{REF}$.

Alternatively, during normal measurement mode, the multiplexor 34 may select the sensor input $V_{IN}$ instead of the test input signal $TEST_{IN}$ and provide the sensor input $V_{IN}$ to the ADC 18. In this case, the sensor input $V_{IN}$ is provided to the ADC 18 per conventional ADC operation. In turn, the ADC 18 converts the sensor input $V_{IN}$ into a digital output code $V_{OUT}$ using the reference voltage $V_{REF}$.

In summary, the system 10 may be configured to provide the sensor input $V_{IN}$ to the ADC 18 in a normal operating mode. For example, the ADC 18 may convert the sensor input $V_{IN}$ into digital samples of voltage values such that a desired function is performed for the vehicle. The ADC 18 may include any number of channels to receive any number of sensor signals. Diagnostics may be performed on a particular channel to verify integrity of the sensor measurements.

Figure 3:
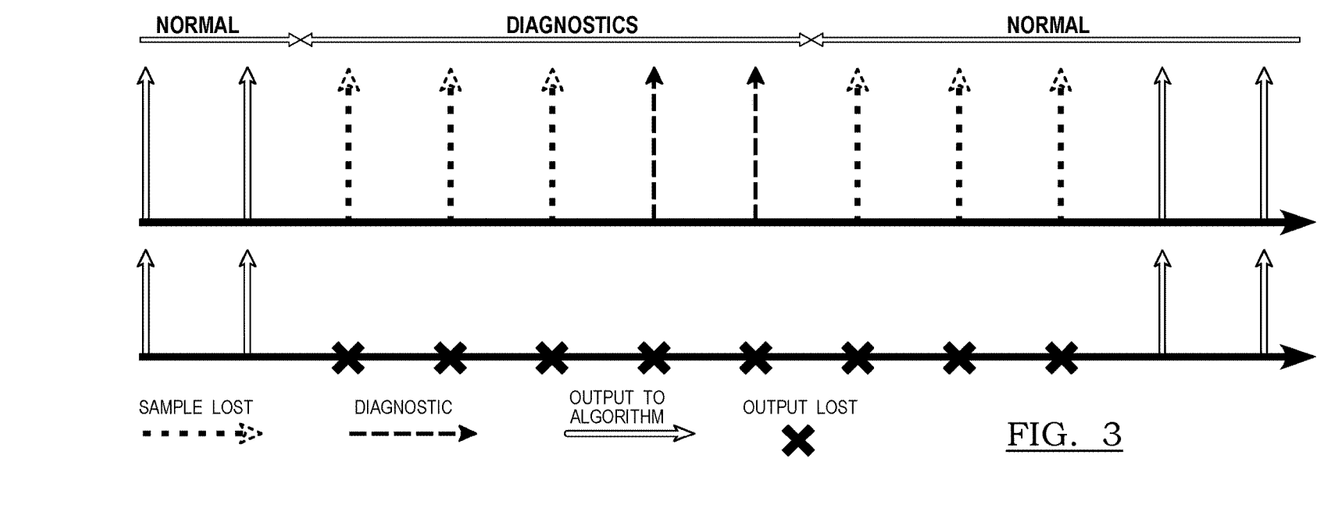
FIG. 3 is a signal timing diagram showing samples received from a converter as compared to samples usable by a controller for an algorithm when no oversampling is used.

Current implementations need to stop the measure of a physical quantity to perform the diagnostics of the circuitry. When the diagnostics is finished, the ADC's input data buffer 36 needs to be filled again and, therefore, the system needs to wait n periods until a valid sample may be completely processed (or output). For example, FIG. 3 shows a digital signal timing diagram showing digital samples received from a converter (top) as compared to digital outputs usable by a controller for an algorithm (bottom) following pre-processing. As shown, 7-8 samples may be lost during each diagnostic phase: 3 samples due to change from normal measure mode to diagnostics mode, 1-2 samples in the diagnostics itself, and 3 samples due to change from diagnostics back to normal measure mode. The lost samples because of diagnostics result in lost digital outputs to the algorithm. Therefore, in current implementations, the diagnostics is usually done at specific time instants where the system is not working in normal mode and samples can be spared or when a possible error is suspected. This implies a high FTTI.

According to one or more embodiments of the present disclosure, a system and method to verify the correctness of the measures in quasi real-time may be implemented at two different levels—a functionality level and a measurement level. The functionality level may involve a consistency check of information from different variables processed at sensor level (e.g., current, voltage, temperature, etc.) depending on the functionality of the physical system being measured, such as whether a battery is charging or discharging. The measurement level may involve the diagnostics of the circuits present in the measurement path by specific circuitry and at suitable instants of time to guarantee an FTTI while minimizing sample loss. This may be accomplished by increasing the measuring sample rate, as will be described in greater detail below. This, in turn, may reduce the time the diagnostic is active.

The strategy at a higher (or functionality) level may involve the computation of a logical function of each pair of physical variables being measured. For instance, in a sensor measuring voltage (V), current (I) and temperature (T), these two-variable pairs are V-I, V-T and I-T. This logical function may compute a 1 if the measured values are consistent with current system conditions (i.e., the physics and functionality of the system being measured). If inconsistencies are detected, the logical function may compute a 0 and corresponding diagnostics may be called. As an example, if inconsistencies are detected in pairs V-I and V-T, but not in I-T, a diagnostic for the voltage measurement path may be activated. This elimination of error strategy may be employed so that the system can react faster during diagnostics.

In a case where no inconsistencies are found, the system 10 may periodically activate the low-level (i.e., measurement level) diagnostics to guarantee the FTTI. When doing diagnostics, some samples may be lost. However, in some situations, it may not be permissible to lose any samples. Accordingly, the higher-level strategy may evaluate the convenience of starting this diagnostic. This can be done in several ways. For instance, the higher-level functions, such as the energy management or the engine control, may not authorize performance of low-level diagnostics at certain specific moments. As an example, during engine starts, in order to exactly measure the current cranking profile, diagnostics may not be authorized. Also, the detection of specific events may inhibit diagnostics from being performed because the measurement information during those events may have greater importance. These specific events may be referred to herein as diagnostic inhibitors. For example, in a battery sensor, by monitoring voltage and current, the starting of a cranking event could be detected and the diagnostics disabled or prohibited during the duration of this event. Stopping or delaying diagnostics during a cranking event may be necessary because the current information is very useful in monitoring the internal resistance of the battery.

The measurement level strategy may include deployment of the diagnostics to verify that the measurements are correct. Since the diagnostics stops the actual measurement of a physical variable, the sampling rate of the measurement may be increased to reduce the time the diagnostics is active. Increasing the sampling rate of an analog voltage signal above the target sampling rate (e.g., the Nyquist rate) may be referred to as oversampling. The target sampling rate may be a sample rate at which alias-free signal sampling occurs and is based in part on the frequency components of the analog signal being measured. A signal is said to be oversampled by a factor of N if it is sampled at N times the Nyquist rate.

The pre-processor 20 may determine what digital information is provided to the controller 24 or directly to the network 28. The digital outputs sent to the controller 24 for processing according to the algorithm or sent directly an ECU 26 may be provided at the target sampling rate. Accordingly, the pre-processor 20 may pre-process the measurements taken at the oversampling rate to generate usable digital outputs 30 for the system 10 at the target sampling rate. For example, the pre-processor 20 may take the average of the last N digital samples to feed to the controller 24.

Figure 4:
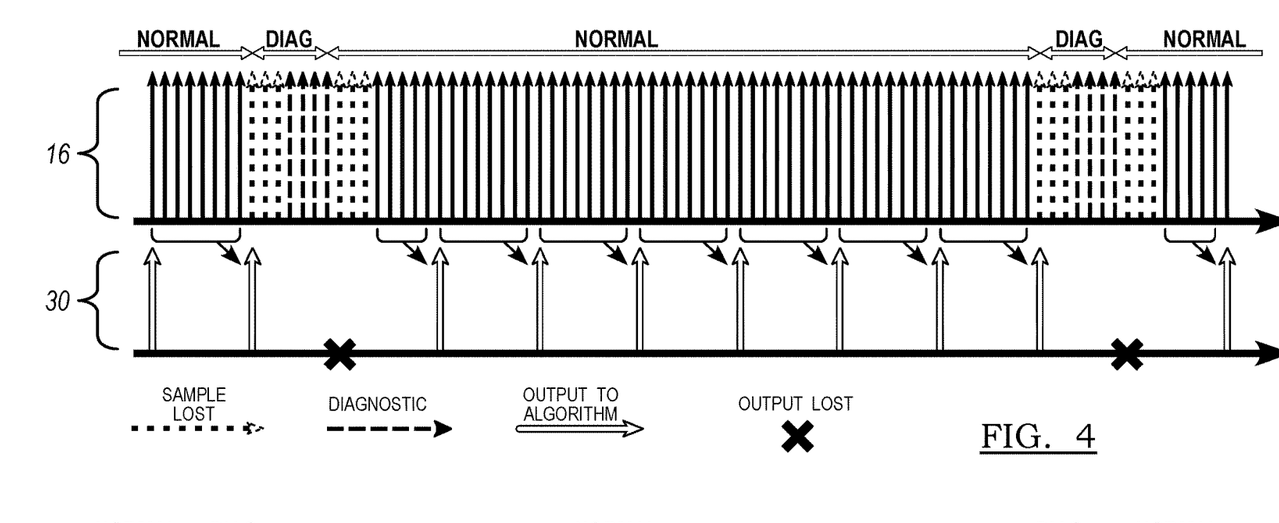
FIG. 4 is a signal timing diagram showing an example of samples received from a converter as compared to samples usable by a controller for an algorithm when oversampling is employed, in accordance with one or more embodiments of the present disclosure.

FIG. 4 shows a digital signal timing diagram of a possible implementation with 8:1 oversampling and 1 digital output lost for each diagnostic phase. As shown, during normal mode, every 8 digital measurement samples 16 converted at the ADC 18 results in one (1) useable digital output 30 from the pre-processor 20 at the target sampling rate. That is, only one sample in every 8 is sent to the controller 24. The digital output 30 sent from the pre-processor 20 to the controller 24, for example, may be computed as the average value of the 8 previously measured "fresh" measurement samples. When switching from normal mode to diagnostics mode, the first n-samples (e.g., first three samples) of the diagnostics at the 8:1 oversampling rate may be unusable (i.e., samples lost) while the input data buffers are being filled. The subsequent "diagnostic" samples taken at the oversampling rate may be used to produce a single digital output for the controller 24 during the diagnostic mode to verify the sensor system is measuring correctly. Thus, only one digital measurement output sample may be lost during the diagnostic phase in this example.

The digital outputs lost to diagnostics may be replaced. For instance, the lost digital output in FIG. 4 may be replaced by a moving average (e.g., the unweighted mean of the previous n data samples) or a previously known good sample/output. Alternatively, the lost output may be replaced using spline interpolation from previous measures (e.g., a 3-order spline). When switching back to normal mode, the first n-samples (e.g., first three samples) of the sensor measurement at the 8:1 oversampling rate may be unusable while the input data buffers are again being re-filled. Accordingly, the first digital output 30 to the controller 24, or algorithm, after the transition to normal mode may be computed as the average value of fewer than 8 previously measured "fresh" samples. In some circumstances, a delay may be introduced between when samples are taken and when the sample average is sent to the controller 24 for processing by the algorithm. Whether a delay is introduced, and the amount of the delay, may depend on the measurement application and customer requirements. If very fresh measures are desired, fewer samples may be used when transitioning from the diagnostics mode to reduce any delay. If accuracy is more important than "freshness," a delay may be introduced in order to utilize more real samples.

Figure 5:
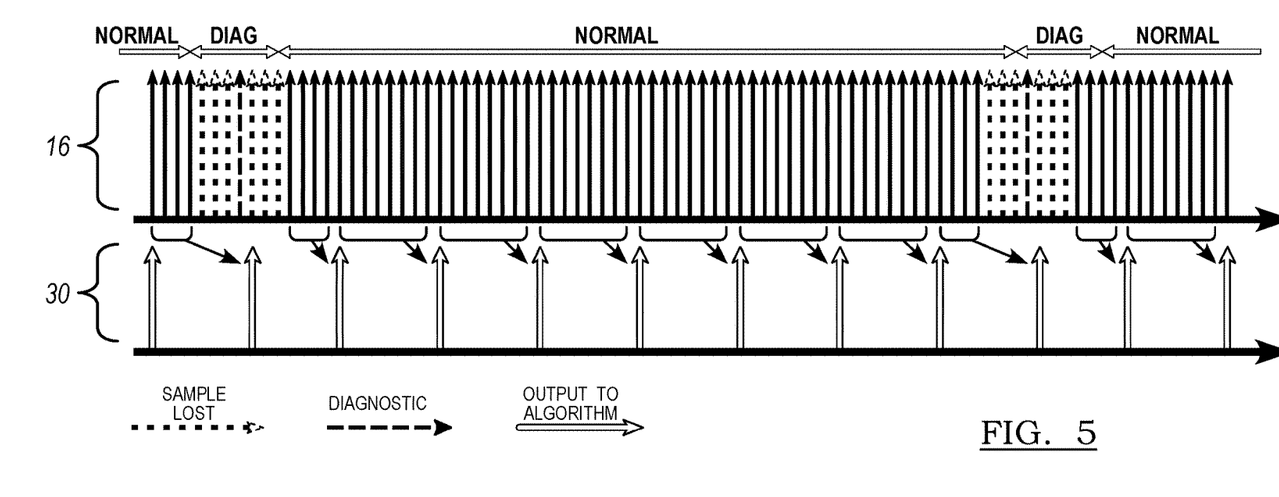
FIG. 5 is a signal timing diagram showing another example of samples received from a converter as compared to samples usable by a controller for an algorithm when oversampling is employed, in accordance with one or more embodiments of the present disclosure.

If the diagnostics can be done using a single measurement or sample, it is possible to employ a strategy to avoid any digital output loss. FIG. 5 shows a digital signal timing diagram of an alternative implementation with 8:1 oversampling that avoids any digital output loss. In this example, the samples provided to the controller 24 before and after the diagnostics are computed using four "fresh" samples instead of eight "fresh" samples as in normal operation. If "freshness" of the samples is not mandatory, other strategies may be employed before and after diagnostics to replace the measurements while the input data buffers fill. As before, these strategies may involve replacing the unusable samples with a moving average, previously known good samples, a three-order spline from previous measures, or the like.

The amount of oversampling may depend on the measurement application. Higher oversampling may be required for certain applications. However, increasing oversampling can increase hardware costs and noise in the signal. Therefore, the oversampling rate may be selected such that it provides good values and timing for the application, while minimizing noise and cost.

Figure 6:
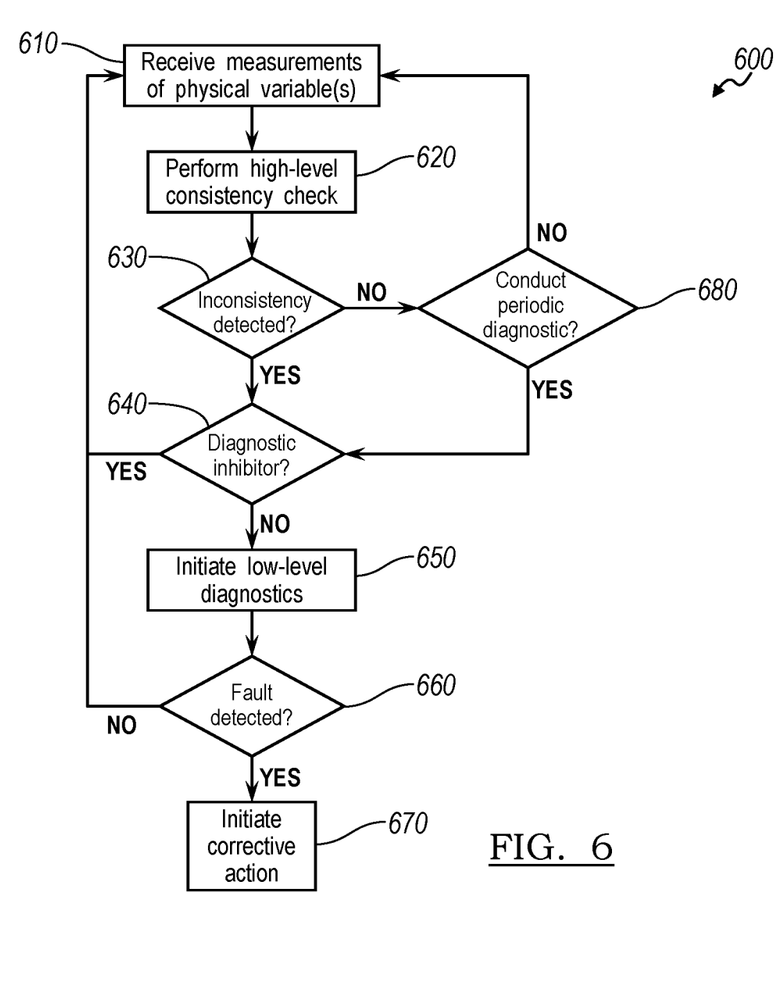
FIG. 6 is a flowchart depicting a method for verifying the correctness of sensor measurements in quasi real-time, in accordance with one or more embodiments of the present disclosure.

FIG. 6 is a flowchart depicting a method 600 to verify the correctness of the sensor measurements in quasi real-time. During a measurement mode, the system 10 may receive measurements of physical variables, as provided at step 610. For example, the system 10 may receive at least one sensor signal, each sensor signal indicative of a physical variable being measured. In particular, the system 10 may receive a first sensor signal indicative of a first variable being measured, a second sensor signal indicative of a second variable being measured, and a third sensor signal indicative of a third variable being measured. In a battery monitoring application, the first variable may be a battery voltage, the second variable may be a battery current, and the third variable may be a battery temperature.

At step 620, a high-level functionality check may be performed. For example, the system 10 may compare measured values of the at least one sensor signal to expected values, wherein the expected values are based on current system conditions. In one or more embodiments, the system 10 may compare pairs of measured values indicative of the first variable, the second variable, and the third variable to similar pairs of expected values, wherein the expected values are based on current system conditions (i.e., the physics and functionality of the system being measured). This comparison may include: comparing a first pair of measured values indicative of the first variable and the second variable to a first pair of expected values based on current system conditions; comparing a second pair of measured values indicative of the first variable and the third variable to a second pair of expected values based on current system conditions; and comparing a third pair of measured values indicative of the second variable and the third variable to a third pair of expected values based on current system conditions.

At step 630, the system 10 may determine whether any inconsistencies are detected based on the comparison performed during the functionality check in step 620. An inconsistency may be detected when the measured values are outside a predetermined range of the expected values. For example, an inconsistency may be detected when two pairs of measured values, each pair having a common variable, are outside a predetermined range of expected values. If an inconsistency is detected at step 630, the system 10 may determine whether a diagnostic inhibitor is present preventing a diagnostic mode from being initiated, as provided at step 640. If a diagnostic inhibitor is present, no diagnostics may be called and the method may return to step 610 to continue receiving sensor measurements.

In the absence of any diagnostic inhibitors, the system 10 may initiate low-level diagnostics, as provided at step 650. For example, the system 10 may initiate diagnostics of a measurement path for a physical variable in response to one of the measured values being outside a predetermined range of the expected values. In the example of an inconsistency being detected when two pairs of measured values, each pair having a common variable, are outside a predetermined range of expected values, the system 10 may initiate diagnostics targeted for the measurement path of the common variable (i.e., a faulty variable). For instance, the system 10 may initiate diagnostics of a measurement path for a faulty variable in response to two pairs of measured values, each including the faulty variable, being outside a predetermined range of expected values, the faulty variable being one of the first variable, the second variable or the third variable. More specifically, the system 10 may initiate diagnostics of a measurement path for the first variable in response to the first pair of measured values being outside a predetermined range of the first pair of expected values and the second pair of measured values being outside a predetermined range of the second pair of expected values.

In response to the first pair of measured values being outside a predetermined range of the first pair of expected values and the third pair of measured values being outside a predetermined range of the third pair of expected values, the system 10 may initiate diagnostics of a measurement path for the second variable. Similarly, the system 10 may initiate diagnostics of a measurement path for the third variable in response to the second pair of measured values being outside a predetermined range of the second pair of expected values and the third pair of measured values being outside a predetermined range of the third pair of expected values.

During the diagnostic mode, the system 10 may receive and process diagnostic signals to verify the measurement path(s) of one or more variables. As set forth above with reference to FIGS. 4 and 5, receiving and processing the diagnostic signal may interrupt the measurement mode. However, according to one or more embodiments, no more than one digital output at the target sampling rate may be lost to the diagnostic mode. Indeed, the diagnostics signal may be processed in between oversampled measurement signals and the corresponding target-rate digital output may be interpolated from remaining samples to avoid any loss of digital outputs to the controller 24.

The system 10 may next determine whether the diagnostics reveals a fault or other error in the measurement path of the physical variable, as provided at step 660. If a fault is detected, the system 10 may proceed to a step 670, upon which corrective action may be initiated. The corrective action may include fixing the fault, notifying other control units (e.g., ECUs 26) in communication with the system 10, and/or notifying a user of the fault. If no fault is detected, the method may return to step 610 to continue receiving sensor measurements.

Returning to step 630, if no inconsistencies are detected, the system 10 may determine whether a predetermined time since the last diagnostic mode occurred has expired, as provided at step 680. If the predetermined time has not lapsed, the method may return to step 610 to continue receiving sensor measurements. If the predetermined time has lapsed, the system 10 may initiate a periodic diagnostic of a measurement path for a physical variable, as provided at step 650, in the absence of any diagnostic inhibitor (step 640).

According to one or more embodiments, the first sensor signal, the second sensor signal, and the third sensor signal may all be analog signals. As previously described, the system 10 may convert each analog signal into digital samples measured at an oversampling rate using the ADC. Moreover, the pre-processor may pre-process the digital samples to generate a digital output for each analog signal at a target sampling rate. The oversampling rate may be N times the target sampling rate. The digital output may be computed as an average value of up to N previously measured digital samples. While the input data buffer fills, a last digital output prior to the diagnostic mode may be computed from less than N previously measured digital samples. Likewise, a first digital output following diagnostics may be computed from less than N previously measured digital samples.

While exemplary embodiments are described above, it is not intended that these embodiments describe all possible forms of the invention. Rather, the words used in the specification are words of description rather than limitation, and it is understood that various changes may be made without departing from the spirit and scope of the invention.

Additionally, the features of various implementing embodiments may be combined to form further embodiments of the invention.

What is claimed is:

1. A method for verifying sensor measurements of physical variables in a system, the method comprising:
   receiving, during a measurement mode, at least a first sensor signal indicative of a first variable being measured, a second sensor signal indicative of a second variable being measured, and a third sensor signal indicative of a third variable being measured;
   comparing pairs of measured values indicative of the first variable, the second variable, and the third variable to similar pairs of expected values, wherein the expected values are based on current system conditions; and
   initiating diagnostics of a measurement path for a faulty variable in response to two pairs of measured values, each including the faulty variable, being outside a predetermined range of expected values, the faulty variable being one of the first variable, the second variable or the third variable.

2. The method of claim 1, wherein the first variable is a battery voltage, the second variable is a battery current, and the third variable is a battery temperature.

3. The method of claim 1, wherein comparing pairs of measured values indicative of the first variable, the second variable, and the third variable to similar pairs of expected values, wherein the expected values are based on current system conditions, comprises:
   comparing a first pair of measured values indicative of the first variable and the second variable to a first pair of expected values based on current system conditions;
   comparing a second pair of measured values indicative of the first variable and the third variable to a second pair of expected values based on current system conditions; and
   comparing a third pair of measured values indicative of the second variable and the third variable to a third pair of expected values based on current system conditions.

4. The method of claim 3, wherein initiating targeted diagnostics of a measurement path for a faulty variable in response to two pairs of measured values, each including the faulty variable, being outside a predetermined range of expected values, the faulty variable being one of the first variable, the second variable or the third variable, comprises:
   initiating diagnostics of a measurement path for the first variable in response to the first pair of measured values being outside a predetermined range of the first pair of expected values and the second pair of measured values being outside a predetermined range of the second pair of expected values.

5. The method of claim 3, wherein initiating targeted diagnostics of a measurement path for a faulty variable in response to two pairs of measured values, each including the faulty variable, being outside a predetermined range of expected values, the faulty variable being one of the first variable, the second variable or the third variable, comprises:
   initiating diagnostics of a measurement path for the second variable in response to the first pair of measured values being outside a predetermined range of the first pair of expected values and the third pair of measured values being outside a predetermined range of the third pair of expected values.

6. The method of claim 3, wherein initiating targeted diagnostics of a measurement path for a faulty variable in response to two pairs of measured values, each including the faulty variable, being outside a predetermined range of expected values, the faulty variable being one of the first variable, the second variable or the third variable, comprises:
   initiating diagnostics of a measurement path for the third variable in response to the second pair of measured values being outside a predetermined range of the second pair of expected values and the third pair of measured values being outside a predetermined range of the third pair of expected values.

7. The method of claim 1, wherein the first sensor signal, the second sensor signal, and the third sensor signal are all analog signals, the method further comprising:
   converting each analog signal into digital samples measured at an oversampling rate; and
   pre-processing the digital samples to generate a digital output for each analog signal at a target sampling rate, wherein the oversampling rate is N times the target sampling rate;
   wherein the digital output is computed as an average value of up to N previously measured digital samples.

8. The method of claim 7, wherein a first digital output following diagnostics is computed from less than N previously measured digital samples.

9. The method of claim 7, wherein diagnostics interrupts the measurement mode.

10. The method of claim 9, wherein no more than one digital output is lost during diagnostics.

11. The method of claim 10, wherein a digital output lost during diagnostics is replaced using one of a moving average, a previously known good sample, and an interpolation from previous measures.

12. A method for verifying sensor measurements of physical variables in a system, the method comprising:
   receiving at least one sensor signal, each sensor signal indicative of a physical variable being measured;
   comparing measured values of the at least one sensor signal to expected values, wherein the expected values are based on current system conditions;
   detecting whether a diagnostic inhibitor is present preventing a diagnostic mode from being initiated; and
   in the absence of any diagnostic inhibitors, initiating diagnostics of a measurement path for a physical variable in response to one of a) the measured values being outside a predetermined range of the expected values and b) a predetermined time since the last diagnostic mode has expired.

13. The method of claim 12, wherein the physical variable includes at least one of a battery voltage, a battery current, and a battery temperature.

14. The method of claim 13, wherein the diagnostic inhibitor includes a battery cranking event.

* * * * *